United States Patent [19]
Ryan et al.

[11] Patent Number: 5,471,300
[45] Date of Patent: Nov. 28, 1995

[54] APPARATUS AND METHOD FOR PROVIDING A FEEDBACK MEASUREMENT IN A LASER SYSTEM

[75] Inventors: Robert E. Ryan, Levittown; Sal Soriano, Rosedale, both of N.Y.

[73] Assignee: Northrop Grumman Corporation, Los Angeles, Calif.

[21] Appl. No.: 226,341

[22] Filed: Apr. 12, 1994

[51] Int. Cl.⁶ .................................................. G01B 9/02
[52] U.S. Cl. ............................................ 356/345; 356/352
[58] Field of Search .................................. 356/352, 345; 250/227.19, 227.27

[56] References Cited

U.S. PATENT DOCUMENTS

| | | | |
|---|---|---|---|
| 4,195,931 | 4/1980 | Hara | 356/352 |
| 4,786,124 | 11/1988 | Stone et al. | 356/345 |
| 4,865,450 | 9/1989 | Munechika et al. | 356/349 |
| 4,907,237 | 3/1990 | Dahmani et al. | 372/32 |
| 4,979,178 | 12/1990 | Beausoleil et al. | 372/20 |
| 5,003,546 | 3/1991 | Lidgard et al. | 356/345 |
| 5,020,062 | 5/1991 | Cusack, Jr. et al. | 372/23 |
| 5,027,435 | 6/1991 | Chraplyvy et al. | 455/617 |
| 5,132,979 | 7/1992 | Erbert | 372/28 |
| 5,185,675 | 2/1993 | Banks | 359/181 |
| 5,268,738 | 12/1993 | Baney et al. | 356/352 |

OTHER PUBLICATIONS

G. A. Acket et al., "The Influence of Feedback Intensity on Longitudinal Mode Properties and Optical Noise in Index-Guided Semiconductor Lasers," IEEE Journal of Quantum Electronics, vol. QE-20, No. 10, Oct. 1984, pp. 1163-1169.

*Primary Examiner*—Samuel A. Turner
*Assistant Examiner*—Jason D. Eisenberg
*Attorney, Agent, or Firm*—Terry J. Anderson; Karl J. Hoch, Jr.

[57] ABSTRACT

The feedback in a laser system is measured in near real time by inducing a frequency shift and the feedback being based on the phase shift undergone by the feedback beam in an external cavity. The frequency shift is induced by phase modulating the feedback beam, for example by varying the position of an optical element placed in the feedback beam upon applying a ramp signal to the optical element. Frequency is detected by a Fabry-Perot interferometer which generates an interference fringe pattern, the intensity of the central fringe being detected to determine the induced frequency shift in real time, the amount of feedback being proportional to the time of flight multiplied by the frequency shift.

14 Claims, 3 Drawing Sheets

APPARATUS AND METHOD FOR PROVIDING A FEEDBACK MEASUREMENT IN A LASER SYSTEM

FIELD OF THE INVENTION

The present invention relates to a method and an apparatus for measuring feedback in a laser system.

BACKGROUND OF THE INVENTION

It is well known that optical feedback in a laser system produces variations in output power, excess noise, and number of other undesirable effects which degrade system performance. The ability to measure optical feedback at various points in a laser system would enable laser system architects to improve the design and construction of their laser systems and thus to enhance system performance by optimizing signal-to-noise ratio.

A method for measuring optical feedback in an index-guided single-mode semiconductor laser is discussed in the article *The Influence of Feedback Intensity on Longitudinal Mode Properties and Optical Noise in Index-Guided Semiconductor Lasers* by Acket, Lenstra, Boef, and Verbeek published in IEEE Journal of Quantum Electronics, Vol. QE-20, No. 10, October 1984. This method involves 1) using a scanning Fabry-Perot interferometer to measure the amount of feedback-induced frequency shift in the semiconductor laser beam and 2) determining the relative strength of the optical feedback by calculating a parameter which is a function of the feedback-induced frequency shift and the external cavity length.

This method has at least one drawback—its use of a scanning Fabry-Perot interferometer increases significantly the number of computations required to measure the frequency shift induced in the laser beam, which in turn slows the rate at which an optical feedback measurement can be provided.

A need exists for a method and apparatus for measuring optical feedback in a laser system which represents a substantial improvement over known methods, and more specifically which is capable of providing a near real time optical feedback measurement at various preselected locations in a laser system.

SUMMARY OF THE INVENTION

Accordingly, it is a principal objective of the present invention to provide a method and a device for providing a near real time measurement of the optical feedback in a laser system.

It is another objective of the present invention to provide a device which can be placed at any location within a laser system to provide a measurement of the amount of feedback at that specific location.

It is another objective of the present invention to provide a device which can be adapted to measure feedback in a wide variety of laser systems including CD players, video laser disc players, and the like.

These and other objectives and advantages of the invention are achieved by providing a device for measuring in near real time the optical feedback in a laser system in which the phase of the feedback beam is modulated to induce a frequency shift, the magnitude of which is detected by a frequency discriminator in order to determine the amount of feedback.

In a preferred embodiment of the invention, detection of the frequency shift is carried out by a fixed Fabry-Perot interferometer whose output is in the form of a plurality of beams which interfere with one another to produce an interference fringe pattern. A photodetector detects the fringe pattern in real time and generates voltage signals proportional to changes in the intensity of a central fringe within the interference fringe pattern. These changes in intensity are used to determine the frequency shift in the feedback signal. A computing means calculates a quantity known as the dressed-feedback parameter from the detected frequency shift and the external cavity roundtrip time to provide a direct measurement of the amount of feedback in the laser system at the preselected point. These and other objectives, features, and advantages of the invention are disclosed in or will be made apparent from the following description of the preferred embodiments of the invention.

BRIEF DESCRIPTION OF THE DRAWINGS

The preferred embodiments are described with reference to the drawings in which.

DESCRIPTION OF THE PREFERRED EMBODIMENTS

Figure 1:
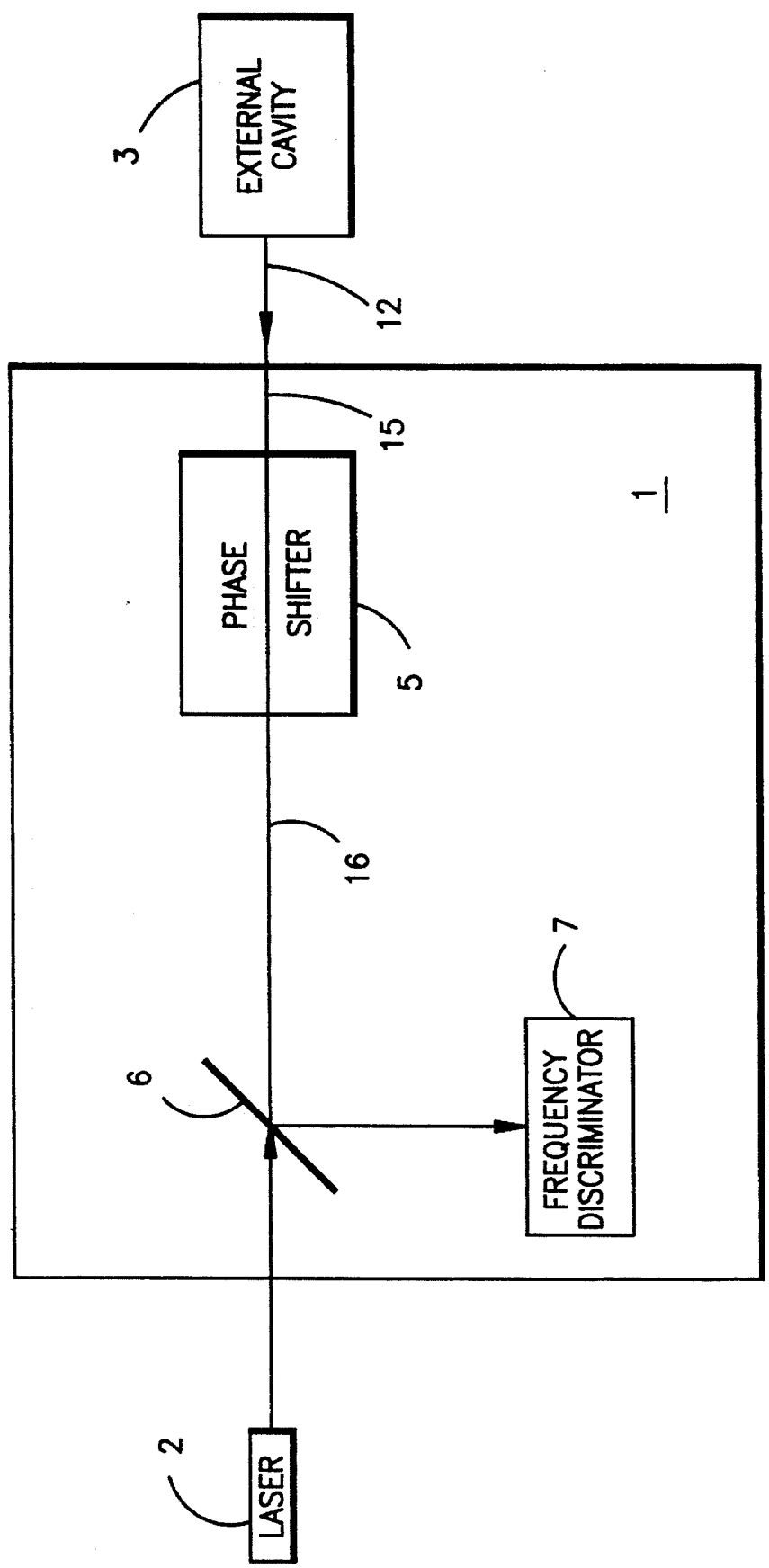
FIG. 1 is a schematic diagram showing the optical feedback meter of the present invention.

Referring to the drawings, FIG. I shows the optical feedback meter 1 of the present invention which can be placed at any location within a laser system to provide a measurement corresponding to the amount of feedback at that specific location. Optical feedback meter 1 includes a phase modulator 5, a beam splitter 6, and a frequency discriminator 7. In operation, a laser feedback beam 12 travelling along a first optical path 15 from external cavity 3 enters into phase modulator 5. Phase modulator 5 is preferably a phase shifter which varies the phase of feedback beam 12 in accordance with a predetermined signal waveform. The phase shift causes beam 12 to become subject to a phase modulation, which in turn induces a measurable shift in the frequency of the beam.

Phase modulated beam 16 exits modulator 5 and is redirected into frequency discriminator 7 by beam splitter 6 which passes the original frequency of light from laser 2. Frequency discriminator 7 detects in real time the frequency shift induced on the phase-modulated beam by the feedback, and this frequency shift is used to calculate a quantity called the dressed-feedback parameter C using the following formula:

$$C = (\Delta \omega_{max} \cdot T_{ext})/2$$

where $\Delta \omega_{max}$ is the detected frequency shift and $T_{ext}$ is the external cavity roundtrip time, which equals twice the length of the external cavity divided by the speed of light. Computation of the dressed-feedback parameter in the manner above permits the optical feedback meter of the present invention to provide a near real time measurement of the amount of feedback in the laser system.

Figure 2:
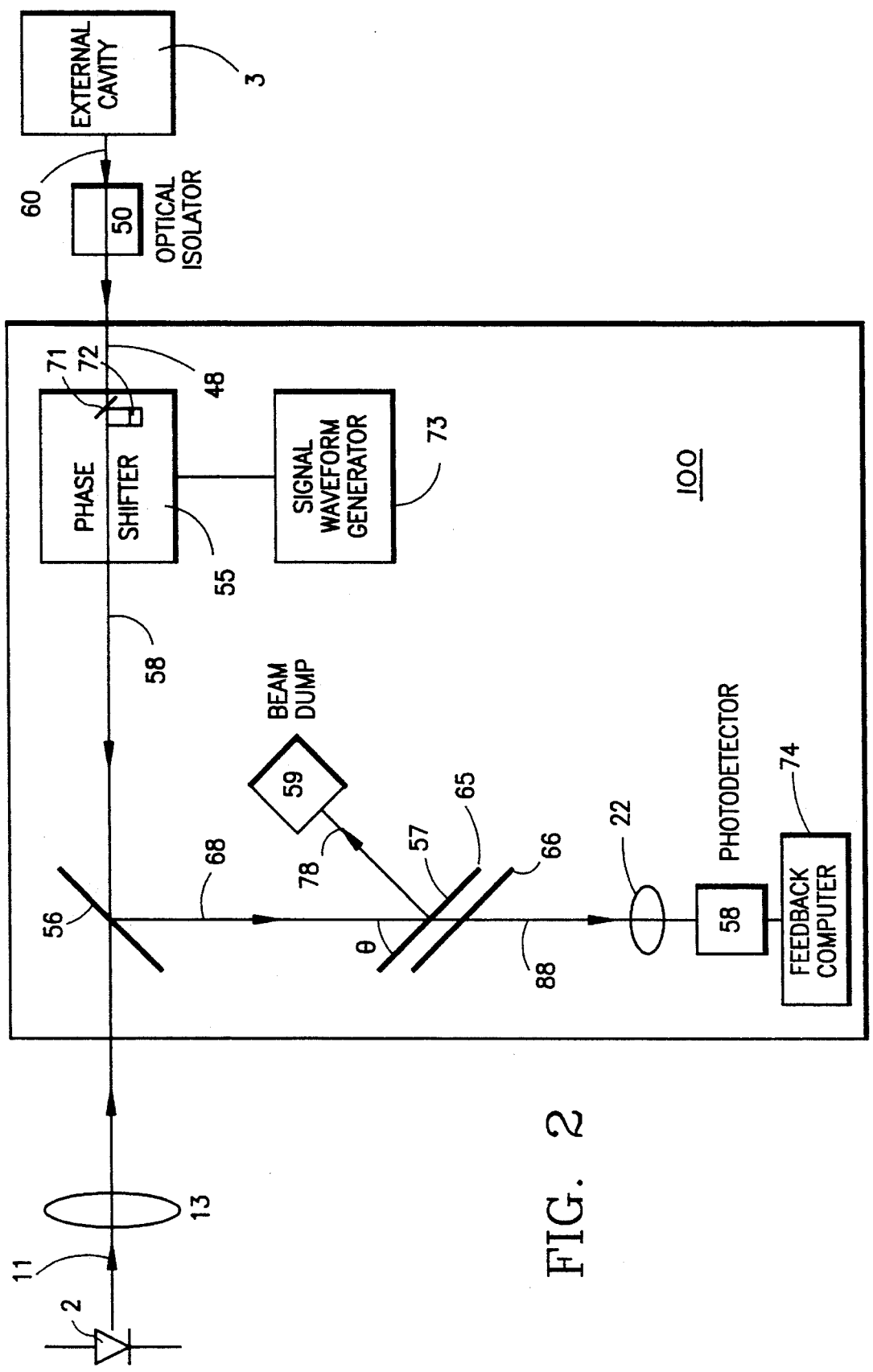
FIG. 2 is a schematic diagram showing a preferred embodiment of the optical feedback meter of the present invention.

FIG. 2 shows a preferred embodiment of the optical feedback meter 100 of the present invention. Meter 100 is situated between a laser source 2 and a predetermined optical system 3 for measuring the optical feedback produced by optical system 3. Laser source 2 is preferably a semiconductor diode laser which emits spectrally pure light, but those skilled in the art will appreciate that any microcavity laser having a cavity length of 1 mm or less may be used.

Optical feedback meter 100 includes a phase shifter 55, a beam splitter 56, a plano-plano Fabry-Perot interferometer 57, a photodetector 58, and a beam dump 59. In operation, laser source 2 emits a main beam 11 which travels through a focusing lens 13, passes through beam splitter 56 and phase shifter 55, and then enters into optical system 3. Beam splitter 56 preferably is a partially-silvered mirror having a 96% to 4% transmission-to-reflection ratio, but those skilled in the art will appreciate that mirrors having other ratios will be deemed to be adequate. Consequently, beam 11 passes through beam splitter 56 and into optical system 3 with no appreciable loss in intensity. Optical system 3 is any arbitrary optical system which resides in an external cavity portion of the laser system.

A laser feedback beam 60 emanating from optical system 3 travels along a first optical path 48 and enters into phase shifter 55. Phase shifter 55 preferably is a mirror 71 mounted on a piezoelectric transducer (PZT) 72, A signal waveform generator applies a predetermined signal waveform, e.g., a ramp voltage signal, to the electrodes of the PZT. The applied waveform causes the PZT to strain or change length in proportion to the signal and this, in turn, causes the mirror to move as a function of the applied signal waveform. The movement of the mirror causes a corresponding phase shift to occur in feedback beam 60. A PZT mirror of this type is disclosed in U.S. Pat. Nos. 4,907,237 and 5,132,979. Those in the art will appreciate that phase shifter 55 also may be any one of a variety of conventional phase shifters including other types of mirror arrangements, galvo-plates, and electro-optic modulators.

Figure 3:
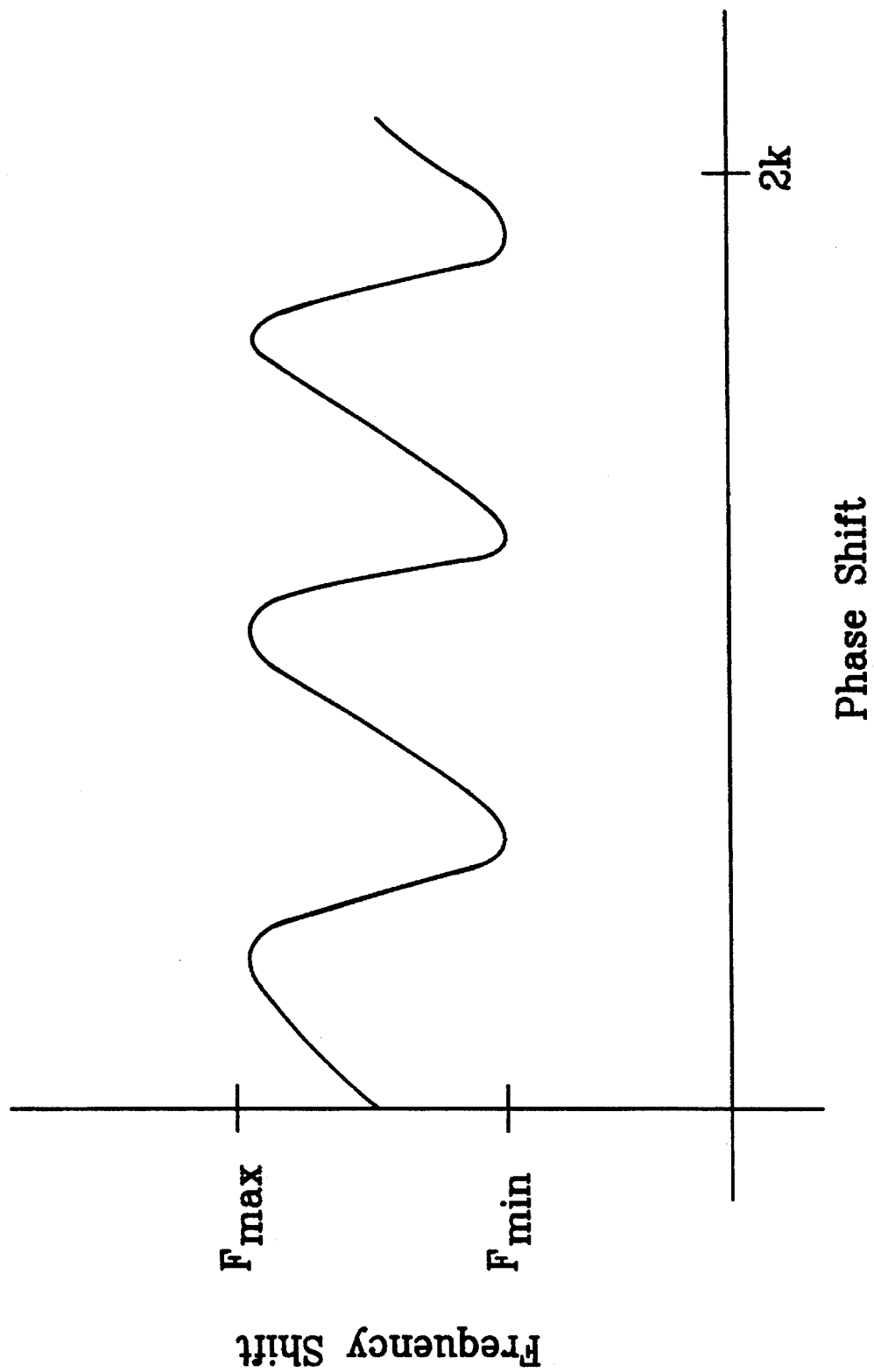
FIG. 3 is a graph showing the relationship between phase shift and frequency shift in a feedback beam passing through the optical feedback meter of the present invention.

The phase shift produced by shifter 55 induces a frequency shift to occur in the feedback beam. FIG. 3 is a graph depicting the relationship between the phase shift of the feedback beam (shown as the ordinate on the graph) and the frequency shift induced in the beam as a result of the phase shift (shown as the abscissa on the graph). The frequency shift is represented as the difference between $F_{max}$ and $F_{min}$. It is this quantity which is used to calculate the amount of optical feedback in the system, as will be described in greater detail below.

After exiting phase shifter 55, now phase-shifted beam 60 travels along a second optical path 58 where it is redirected by beam splitter 56 onto a third optical path 68. The beam then passes through an optical isolator 30 and enters Fabry-Perot interferometer 57. Fabry-Perot interferometer 57 consists of two plane, parallel glass mirrors, upper mirror 65 and lower mirror 66, which are spaced a predetermined distance apart.

Upon entering interferometer 57, feedback beam 60 experiences a series of partial reflections between upper mirror 65 and lower mirror 66. Each time a beam reflects off of upper mirror 65, a portion of that beam exits the interferometer along a fourth optical path 78. As depicted in FIG. 2, Fabry-perot interferometer 57 is mounted in a fixed position and is advantageously tilted a predetermined angle θ relative to the third optical beam path so that beams which reflect off interferometer 57 will not reflect back into the optical system as feedback. An optical isolator (not shown) may be added along optical path 68 as an added measure of protection against optical feedback. The beams reflecting off interferometer 57 are directed along optical path 78 until they enter into beam dump 59.

Beam dump 59 preferably is a series of specular reflectors (not shown), each of which reflects approximately 5% and attenuates approximately 95% of a light beam incident thereon. The specular reflectors are constructed from a material which is optically thick or opaque, e.g., black glass, at the wavelength of interest. The beam dump attenuates beams reflected off of interferometer 57 by 30 dB or more.

Each time a beam reflects off of lower mirror 66, a portion of that beam is transmitted through the interferometer along a fifth optical path 88. The resulting output of the Fabry-Perot interferometer consists of a plurality of beams each associated with a different reflection at plate 66. A focusing lens 22 focuses the transmitted beams exiting interferometer 57 onto photodetector 58 where they interfere with each other to create an interference fringe pattern. The spacing between plates 65 and 66 is adjusted so that the transmitted beams interfere constructively, a result of which is to cause the interferometer to operate near resonance.

The real time detection of the frequency shift in beam 60 will now be explained. As an initial step, the Fabry-Perot interferometer is adjusted so that transmission therethrough is at the steepest slope possible as a function of frequency. A frequency shift in the feedback beam causes the transmission characteristics of the Fabry-Perot interferometer to shift away from this position. This shift can be detected by examining the central fringe in the interference fringe pattern. Specifically, shifts away from the initial setting translate as changes in the intensity of the central fringe in the interference fringe pattern. Thus, shifts in the frequency of the feedback beam can be measured as changes in the intensity of the central fringe. Photodetector 58 generates voltage signals proportional to the changes in intensity of the central fringe which are then used to derive the frequency shift $\Delta\omega_{max}$ in the feedback beam. This frequency shift represents the difference between the frequency maximum $F_{max}$ and the frequency minimum $F_{min}$, as depicted in FIG. 3. The ability to measure the frequency shift in real time enables the optical feedback meter of the present invention to provide a near real time measurement of the feedback according to the calculations that will now be discussed.

Once the frequency shift has been determined, a computer or calculator 74 may be used to calculate the dressed-feedback parameter using the detected frequency shift and the external cavity roundtrip time, which equals twice the distance of the optical path through optical system 3 divided by the speed of light. The dressed-feedback parameter provides a direct measurement of the amount of feedback in the laser system.

The optical feedback meter of the present invention advantageously can be adapted to provide a near real time optical feedback measurement at any location within an optical system and can be used to measure feedback in a variety of laser systems, including CD players, video laser disc players, etc.

Other modifications and variations to the invention will be apparent to those skilled in the art from the foregoing disclosure and teachings. Thus, while only certain embodiments of the invention have been specifically described herein, is will be apparent that numerous modifications may be made thereto without departing from the spirit and scope of the invention.

What is claimed is:

1. A device for providing a near real time optical feedback measurement in a laser system, said device comprising:

means for phase modulating the feedback to induce a shift in a frequency of the feedback;

frequency discriminating means for detecting in real time the frequency shift induced in said feedback; and means for computing an amount of feedback at a preselected location as a function of the detected frequency shift.

2. The device of claim 1, wherein said means for modulating a phase shift of the feedback comprises a signal waveform generator connected to a phase shifter for causing said phase shifter to vary a phase of the feedback in accordance with a preselected signal waveform.

3. The device of claim 2, wherein said preselected signal waveform is a ramp voltage signal.

4. The device of claim 2, wherein said phase shifter is a mirror mounted on a piezoelectric transducer, said transducer providing movement to the mirror in accordance with said preselected waveform.

5. A device as claimed in claim 1, further comprising a means including a beam splitter for separating said frequency shifted feedback from an incident laser beam and for guiding said feedback to said frequency discriminating means.

6. The device of claim 1, wherein said frequency discriminating means is a fixed Fabry-Perot interferometer whose output comprises a plurality of beams which interfere with one another to produce an interference fringe pattern.

7. The device of claim 6, further comprising:

a focusing lens for focusing said plurality of beams onto a predetermined location;

a detector at said predetermined location for detecting the interference fringe pattern, a central fringe within said fringe pattern changing in intensity in proportion to the frequency shift in said feedback, said detector providing voltage signals proportional to the changes in the intensity of said central fringe to provide a measurement of the frequency shift in said feedback.

8. The device of claim 6, wherein the Fabry-Perot interferometer is tilted at a predetermined angle for preventing beams reflecting from said interferometer from re-entering the laser system as feedback.

9. The device of claim 8, further comprising a beam dump for attenuating the beams reflected from said interferometer.

10. The device of claim 1, wherein said computing means calculates a quantity C representing a dressed-feedback parameter using the following formula:

$$C = (\Delta\omega_{max} \cdot T_{ext})/2$$

where $\Delta\omega_{max}$ is the frequency shift detected in a feedback beam and $T_{ext}$ is an external cavity roundtrip time, said dressed feedback parameter providing a direct measurement of an amount of feedback in the laser system at.

11. A method for providing a near real time feedback measurement in an optical system, said method comprising the steps of:

(a) phase modulating said feedback at a preselected point within said optical system to induce a frequency shift in said feedback relative to an incident beam;

(b) detecting said frequency shift in real time by passing the feedback through a frequency discriminator; and (c) calculating the amount of feedback at said point as a function of the detected frequency shift and roundtrip time of an external cavity.

12. A method as claimed in claim 11, wherein said step of modulating comprises the step of applying a ramp waveform to a piezoelectric transducer in order to shift a position of an optical element positioned in a path of said feedback.

13. A method as claimed in claim 11, wherein step (b) comprises the step of generating an interference fringe pattern from a frequency shifted signal, and detecting said frequency shift as changes in an intensity of a central fringe within said interference fringe pattern.

14. A method as claimed in claim 11, wherein step (c) comprises the step of calculating a dressed-feedback parameter using the following formula:

$$C = (\Delta\omega_{max} \cdot T_{ext})/2$$

where $\Delta\omega_{max}$ is the frequency shift detected in the feedback and $T_{ext}$ is an external cavity roundtrip time.

* * * * *